(12) United States Patent
Kwak

(10) Patent No.: US 9,449,662 B1
(45) Date of Patent: Sep. 20, 2016

(54) SEMICONDUCTOR MEMORY APPARATUS

(71) Applicant: SK hynix Inc., Icheon-si, Gyeonggi-do (KR)

(72) Inventor: Seung Wook Kwak, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 14/807,224

(22) Filed: Jul. 23, 2015

(30) Foreign Application Priority Data

Apr. 10, 2015 (KR) .................. 10-2015-0050959

(51) Int. Cl.
*G11C 7/00* (2006.01)
*G11C 7/22* (2006.01)

(52) U.S. Cl.
CPC ...................... *G11C 7/22* (2013.01)

(58) Field of Classification Search
CPC .................. G11C 7/22; G11C 7/222
USPC .......... 365/189.07, 189.09, 191, 194, 230.06
See application file for complete search history.

(56) References Cited

U.S. PATENT DOCUMENTS

| 2010/0142295 A1* | 6/2010 | Seo | G11C 5/143 365/194 |
| 2010/0315883 A1* | 12/2010 | Lee | G11C 16/32 365/185.25 |
| 2014/0313837 A1* | 10/2014 | Kwak | G11C 7/1018 365/189.05 |

FOREIGN PATENT DOCUMENTS

| KR | 1020060091903 A | 8/2006 |
| KR | 1020070093253 A | 9/2007 |

* cited by examiner

*Primary Examiner* — Tan T. Nguyen
(74) *Attorney, Agent, or Firm* — William Park & Associates Ltd.

(57) ABSTRACT

A semiconductor memory apparatus may include: a command decoder configured to decode an external command and output the decoded command as an internal command; a command transmitter configured to determine a delay time in response to a voltage level of an external voltage being applied to the semiconductor memory apparatus, delay the internal command by the determined delay time, and output the delayed internal command as a delayed command; and a data storage area configured to receive the delayed command, and perform an operation according to the delayed command.

10 Claims, 3 Drawing Sheets

1

SEMICONDUCTOR MEMORY APPARATUS

CROSS-REFERENCES TO RELATED APPLICATION

The present application claims priority under 35 U.S.C. §119(a) to Korean application number 10-2015-0050959 filed on Apr. 10, 2015, in the Korean Intellectual Property Office, which is incorporated herein by reference in its entirety.

BACKGROUND

1. Technical Field

Various embodiments relate to a semiconductor integrated circuit, and more particularly to a semiconductor memory apparatus.

2. Related Art

In general, a semiconductor memory apparatus may store data or output data stored therein in response to a command inputted from an external device such as a memory controller.

Due to the high speed of the semiconductor memory apparatus and the memory controller, timing requirements must be met such that requested operations are done within a predetermined time after a command is inputted.

However, process variation of transistors, which form the semiconductor memory apparatus, may cause the performance of the requested operations to fall below the timing requirements.

SUMMARY

In an embodiment of the present disclosure, a semiconductor memory apparatus may include: a command decoder configured to decode an external command and output the decoded command as an internal command; a command transmitter configured to determine a delay time in response to the voltage level of an external voltage, delay the internal command by the determined delay time, and output the delayed internal command as a delayed command; and a data storage area configured to receive the delayed command, and perform an operation according to the delayed command.

In an embodiment of the present disclosure, a semiconductor memory apparatus may include: a command transmitter configured to receive an internal command, delay the received internal command, and output the delayed internal command as a delayed command; and a data storage area configured to perform an operation according to the delayed command. The command transmitter may determine the number of delays through which the internal command is passed according to the voltage level of an external voltage.

In an embodiment of the present disclosure, a semiconductor memory apparatus may include: a delay control unit configured to detect an external voltage level being applied to the semiconductor memory apparatus, and provide a delay control signal selected, depending on the external voltage level, between a plurality of delay control signals; and a variable delay unit comprising a plurality of delays coupled in series, each delay having an input node for receiving an internal command generated based on the delay control signal. A total delay time of the variable delay unit may vary depending on which delay receives the internal command.

BRIEF DESCRIPTION OF THE DRAWINGS

Features, aspects, and embodiments are described in conjunction with the attached drawings, in which.

DETAILED DESCRIPTION

Figure 1:
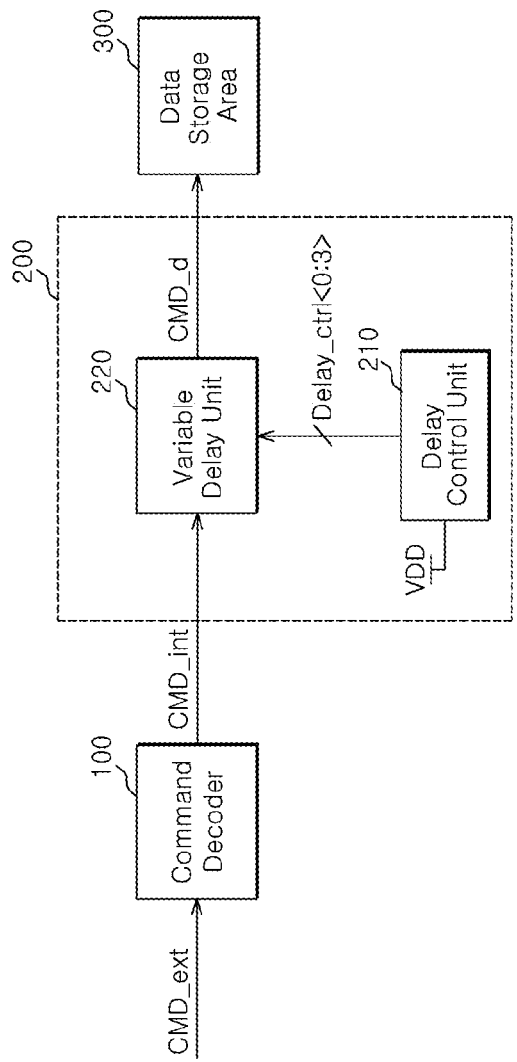
FIG. 1 is a configuration diagram of a semiconductor memory apparatus according to an embodiment of the present disclosure.

FIG. 1 is a configuration diagram of a semiconductor memory apparatus according to an embodiment of the present disclosure.

As illustrated in FIG. 1, a semiconductor memory apparatus according to an embodiment of the present disclosure may include a command decoder 100, a command transmitter 200, and a data storage area 300.

The command decoder 100 may receive an external command CMD_ext from external devices such as a controller (not illustrated), and generate an internal command CMD_int. For example, the command decoder 100 may generate the internal command CMD_int by decoding the external command CMD_ext.

The command transmitter 200 may delay the internal command CMD_int by a preset time, and output the delayed internal command as a delayed command CMD_d. Here, the command transmitter 200 may increase or decrease the preset time according to a voltage level of an external voltage VDD. The external voltage VDD may include an operating voltage of the semiconductor memory apparatus.

The command transmitter 200 may include a delay control unit 210 and a variable delay unit 220.

The delay control unit 210 may detect the voltage level of the external voltage VDD, and generate first to fourth delay control signals Delay_ctrl<0:3>. For example, the delay control unit 210 may enable one of the first to fourth delay control signals Delay_ctrl<0:3> in response to the voltage level of the external voltage VDD. In an embodiment, when the voltage level of the external voltage VDD is lower than a first preset voltage level, the delay control unit 210 may enable the first delay control signal Delay_ctrl<0> selected between the first to fourth delay control signals Delay_ctrl<0:3>. When the voltage level of the external voltage VDD is equal to the first preset voltage level, the delay control unit 210 may enable the second delay control signal Delay_ctrl<1> selected between the first to fourth delay control signals Delay_ctrl<0:3>. when the voltage level of the external voltage VDD is higher than the first preset voltage level but lower than a second preset voltage level, the delay control unit 210 may enable the third delay control signal Delay_ctrl<2> selected between the first to fourth delay control signals Delay_ctrl<0:3>. When the voltage level of the external voltage VDD is higher than the second preset voltage level, the delay control unit 210 may enable the fourth delay control signal Delay_ctrl<3> selected between the first to fourth delay control signals Delay_ctrl<0:3>.

The variable delay unit 220 may determine a delay time in response to the first to fourth delay control signals Delay_ctrl<0:3>, delay the internal command CMD_int by the determined delay time, and output the delayed internal command as the delayed command CMD_d. For example, when the first delay control signal Delay_ctrl<0> is enabled, the variable delay unit 220 may delay the internal command CMD_int by a first delay time (e.g., the shortest delay time), and output the delayed internal command as the delayed command CMD_d. When the second delay control signal Delay_ctrl<1> is enabled, the variable delay unit 220 may delay the internal command CMD_int by a second delay time, which has a longer delay time than the first delay time but has a shorter delay time than a third delay time that is a delay time when the first delay control signal Delay_ctrl<0> is enabled, and output the delayed internal command as the delayed command CMD_d. When the third delay control signal Delay_ctrl<2> is enabled, the variable delay unit 220 may delay the internal command CMD_int by the third delay time, which is a longer delay time than the second delay time, and output the delayed internal command as the delayed command CMD_d. When the fourth delay control signal Delay_ctrl<3> is enabled, the variable delay unit 220 may delay the internal command CMD_int by a fourth delay time, which is a longer delay time than the third delay time, and output the delayed internal command as the delayed command CMD_d.

The data storage area 300 may receive the delayed command CMD_d, and perform an operation according to the delayed command CMD_d.

Figure 2:
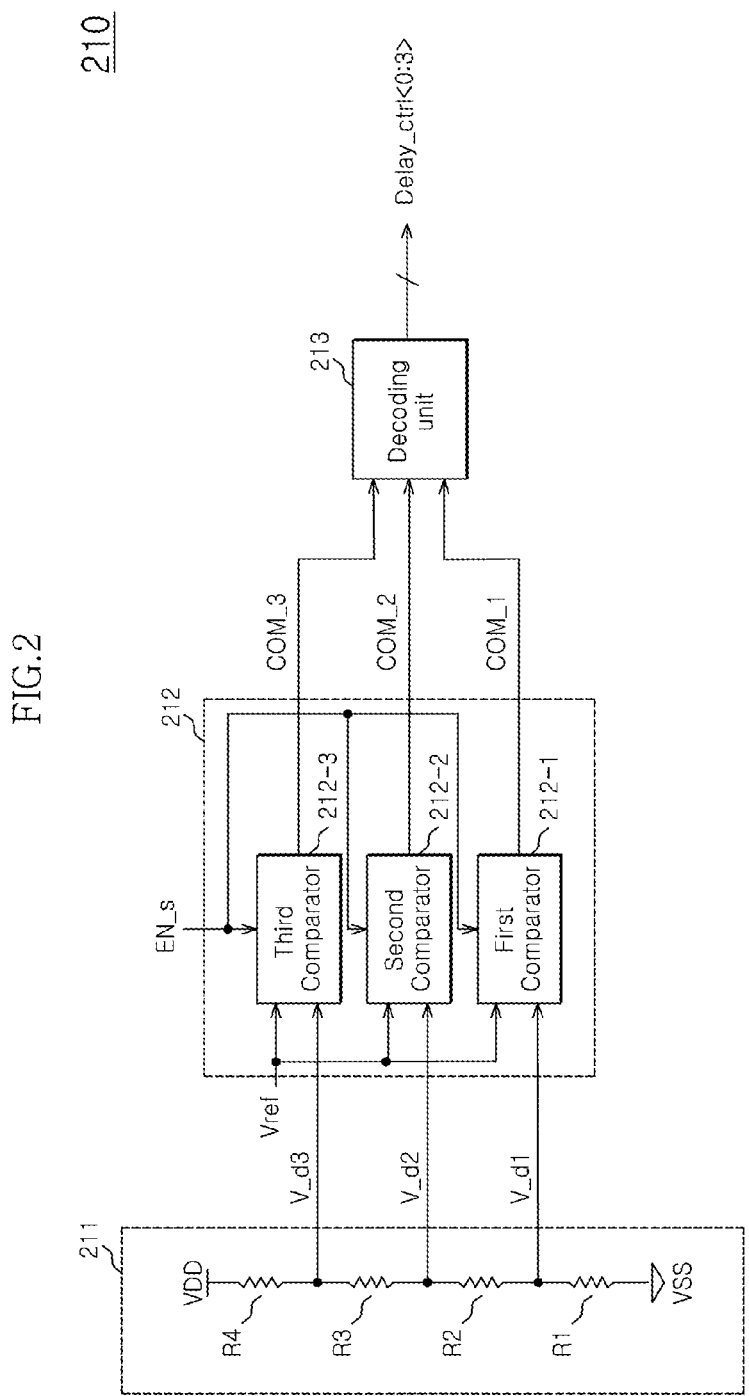
FIG. 2 is a configuration diagram of a delay control unit of FIG. 1.

As illustrated in FIG. 2, the delay control unit 210 may include a divided voltage generation unit 211, a comparison signal generation unit 212, and a decoding unit 213.

The divided voltage generation unit 211 may generate first to third divided voltages V_d1 to V_d3 by dividing the external voltage VDD. Here, the first divided voltage V_d1 may have the lowest voltage level, and the third divided voltage V_d1 may have the highest voltage level. The second divided voltage V_d2 may have a voltage level between the voltage levels of the first and third divided voltages V_d1 and V_d3.

The divided voltage generation unit 211 may include first to fourth resistors R1 to R4. The first to fourth resistors R1 to R4 may be coupled in series, and the external voltage VDD and a ground voltage VSS may be applied across the first to fourth resistors R1 to R4 coupled in series. More specifically, the first resistor R1 may receive the ground voltage VSS through one end thereof. The second resistor R2 may have one end coupled to the other end of the first resistor R1. The third resistor R3 may have one end coupled to the other end of the second resistor R2. The fourth resistor R4 may have one end coupled to the other end of the third resistor R3, and receive the external voltage VDD through the other end thereof. The first divided voltage V_d1 may be outputted from a node to which the first and second resistors R1 and R2 are coupled. The second divided voltage V_d2 may be outputted from a node to which the second and third resistors R2 and R3 are coupled. The third divided voltage V_d3 may be outputted from a node to which the third and fourth resistors R3 and R4 are coupled.

The comparison signal generation unit 212 may compare each of the first to third divided voltages V_d1 to V_d3 to the voltage level of a reference voltage Vref, and generate first to third comparison signals COM_1 to COM_3. For example, when the voltage levels of the first to third divided voltages V_d1 to V_d3 are lower than the voltage level of the first reference voltage Vref, the comparison signal generation unit 212 may disable all of the first to third comparison signals COM_1 to COM_3. When only the voltage level of the third divided voltage V_d3 is higher than the voltage level of the reference voltage Vref, the comparison signal generation unit 212 may enable only the third comparison signal COM_3. When only the voltage levels of the second and third divided voltages V_d2 and V_d3 are higher than the voltage level of the reference voltage Vref, the comparison signal generation unit 212 may enable only the second and third comparison signal COM_2 and COM_3. The comparison signal generation unit 212 may enable all of the first to third comparison signals COM_1 to COM_3 when the voltage levels of the first to third divided voltages V_d1 to V_d3 are higher than the voltage level of the reference voltage Vref.

The comparison signal generation unit 212 may include first to third comparators 212-1 to 212-3.

The first comparator 212-1 may generate the first comparison signal COM_1 by comparing the first divided voltage V_d1 and the reference voltage Vref, when an enable signal EN_s is enabled. For example, when the voltage level of the first divided voltage V_d1 is lower than the voltage level of the reference voltage Vref, the first comparator 212-1 may disable the first comparison signal COM_1. When the voltage level of the first divided voltage V_d1 is higher than the voltage level of the reference voltage Vref, the first comparator 212-1 may enable the first comparison signal COM_1.

The second comparator 212-2 may generate the second comparison signal COM_1 by comparing the second divided voltage V_d2 and the reference voltage Vref, when the enable signal EN_s is enabled. For example, when the voltage level of the second divided voltage V_d2 is lower than the voltage level of the reference voltage Vref, the second comparator 212-2 may disable the second comparison signal COM_2. When the voltage level of the second divided voltage V_d2 is higher than the voltage level of the reference voltage Vref, the second comparator 212-2 may enable the second comparison signal COM_2.

The third comparator 212-3 may generate the third comparison signal COM_1 by comparing the third divided voltage V_d2 and the reference voltage Vref, when the enable signal EN_s is enabled. For example, when the voltage level of the third divided voltage V_d3 is lower than the voltage level of the reference voltage Vref, the third comparator 212-3 may disable the third comparison signal COM_3. When the voltage level of the third divided voltage V_d3 is higher than the voltage level of the reference voltage Vref, the third comparator 212-3 may enable the third comparison signal COM_3.

The decoding unit 213 may generate the first to fourth delay control signals Delay_ctrl<0:3> in response to the first to third comparison signals COM_1 to COM3. For example, the decoding unit 213 may enable one of the first to third delay control signals Delay_ctrl<0:3> by decoding the first to third comparison signals COM_1 to COM3. In an embodiment, when all of the first to third comparison signals COM_1 to COM3 are disabled, the decoding unit 213 may enable only the first delay signal Delay_ctrl<O>. When only the third comparison signal COM_3 is enabled, the decoding unit 213 may enable only the second delay control signal Delay_ctrl<1>. When only the second and third comparison signals COM_2 and COM_3 are enabled, the decoding unit 213 may enable only the third delay control signal Delay_ctrl<2> When all of the first to third comparison signals COM_1 to COM3 are enabled, the decoding unit 213 may enable only the fourth delay signal Delay_ctrl<3>.

The decoding unit 213 may be operated as illustrated in the following table.

| COM_1 | COM_2 | COM_3 | Delay_ctrl<0> | Delay_ctrl<0> | Delay_ctrl<0> | Delay_ctrl<0> |
|---|---|---|---|---|---|---|
| Disable | Disable | Disable | Enable | Disable | Disable | Disable |
| Disable | Disable | Enable | Disable | Enable | Disable | Disable |
| Disable | Enable | Enable | Disable | Disable | Enable | Disable |
| Enable | Enable | Enable | Disable | Disable | Disable | Enable |

Figure 3:
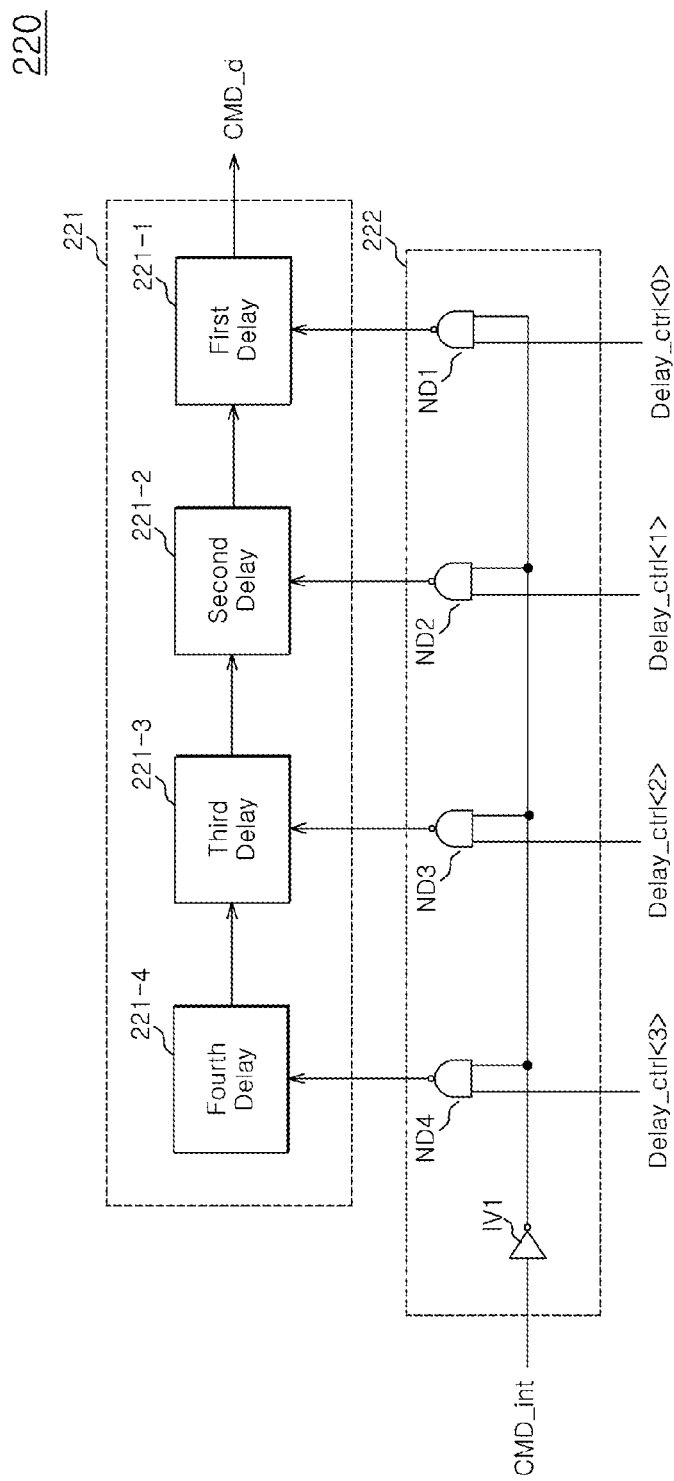
FIG. 3 is a configuration diagram of a variable delay unit of FIG. 1.

As illustrated in FIG. 3, the variable delay unit 220 may include a delay chain 221 and an input selection unit 222.

The delay chain 221 may include first to fourth delays 221-1 to 221-4 coupled in series.

The first delay 221-1 may delay an output signal of the second delay 221-2 or an output signal of the input selection unit 222, and output the delayed signal as the delayed command CMD_d.

The second delay 221-1 may delay an output signal of the third delay 221-3 or an output signal of the input selection unit 222, and output the delayed signal as an input signal of the first delay 221-1.

The third delay 221-3 may delay an output signal of the fourth delay 221-4 or an output signal of the input selection unit 222, and output the delayed signal as an input signal of the second delay 221-2.

The fourth delay 221-4 may receive an output signal of the input selection unit 222, and output the received signal as an input signal of the third delay 221-3.

The input selection unit 222 may input the internal command CMD_int to one of the first to fourth delays 221-1 to 221-4 in response to the first to fourth delay control signals Delay_ctrl<0:3>. For example, when the first delay control signal Delay_ctrl<O> is enabled, the input selection unit 222 may input the internal command CMD_int to the first delay 221-1. When the second delay control signal Delay_ctrl<1> is enabled, the input selection unit 222 may input the internal command CMD_int to the second delay 221-2. When the third delay control signal Delay_ctrl<2> is enabled, the input selection unit 222 may input the internal command CMD_int to the third delay 221-3. When the fourth delay control signal Delay_ctrl<3> is enabled, the input selection unit 222 may input the internal command CMD_int to the fourth delay 221-4.

The input selection unit 222 may include an inverter IV1 and first to fourth NAND gates ND1 to ND4. The inverter IV1 may receive the internal command CMD_int. The first NAND gate ND1 may receive an output signal of the inverter IV1 and the first delay control signal Delay_ctrl<0>, and output an output signal to the first delay 221-1. The second NAND gate ND2 may receive the output signal of the inverter IV1 and the second delay control signal Delay_ctrl<0>, and output an output signal to the second delay 221-2. The third NAND gate ND3 may receive the output signal of the inverter IV1 and the third delay control signal Delay_ctrl<2>, and output an output signal to the third delay 221-3. The fourth NAND gate ND4 may receive the output signal of the inverter IV1 and the fourth delay control signal Delay_ctrl<3>, and output an output signal to the fourth delay 221-4.

The operation of the semiconductor memory apparatus having the above configuration according to the embodiment of the present disclosure will be described below.

First, an external command CMD_ext from outside the semiconductor memory apparatus may be inputted to the semiconductor memory apparatus.

The command decoder 100 may generate an internal command CMD_int by decoding the external command CMD_ext. For example, the command decoder 100 may decode the external command CMD_ext, and generate the internal command CMD_int corresponding to a read command or write command when the external command CMD_ext is the read command or write command.

The command transmitter 200 may delay the internal command CMD_int during a preset delay time, and transmit the delayed command to the data storage area 300. The command transmitter 200 may generate a delayed command CMD_d by delaying the internal command CMD_int, and output the delayed command CMD_d to the data storage area 300. Furthermore, according to an operating voltage level (e.g., an external voltage VDD) of the semiconductor memory apparatus, the command transmitter 200 may increase or decrease the delay time by which the internal command CMD_int is to be delayed. For example, when the voltage level of the external voltage VDD is higher than a preset voltage level, the command transmitter 200 may increase the delay time by which the internal command CMD_int is to be delayed. Furthermore, when the voltage level of the external voltage VDD is lower than the preset voltage level, the command transmitter 200 may decrease the delay time by which the internal command CMD_int is to be delayed.

The operation of the command transmitter 200 will be described in detail as follows.

The command transmitter 200 may include the delay control unit 210 and the variable delay unit 220.

The delay control unit 210 may enable one of the first to fourth delay control signals Delay_ctrl<0:3> according to the voltage level of the external voltage VDD.

Referring to FIG. 2, the delay control unit 210 may include the divided voltage generation unit 211, the comparison signal generation unit 212, and the decoding unit 213.

The divided voltage generation unit 211 may divide the external voltage VDD, and generate first to third divided voltages V_d1 to V_d3. Here, the first divided voltage V_d1 may have the lowest voltage level, and the third divided voltage V_d3 may have the highest voltage level. The voltage level of the second divided voltage V_d2 may correspond to an intermediate level between the voltage levels of the first and third divided voltages V_d1 and V_d3. Since the first to third divided voltages V_d1 to V_d3 are generated by dividing the external voltage VDD, the first to third divided voltages V_d1 to V_d3 may rise as the voltage level of the external voltage VDD rises, and fall as the voltage level of the external voltage VDD falls.

When all of the voltage levels of the first to third divided voltages V_d1 to V_d3 are lower than the voltage level of the first reference voltage Vref, the comparison signal generation unit 212 may disable all of the first to third comparison signals COM_1 to COM_3. When the first to third comparison signals COM_1 to COM_3 are disabled, it may indicate that the voltage level of the external voltage VDD is lower than a first preset voltage level.

When only the third divided voltage V_d3 out of the three divided voltages V_d1 to V_d3 is higher than the voltage level of the reference voltage Vref, the comparison signal generation unit 212 may enable only the third comparison signal COM_3 out of the three comparison signals COM_1 to COM_3. When only the third comparison signal COM_3 is enabled, it may indicate that the voltage level of the external voltage VDD is equal to the first preset voltage level.

When only the voltage levels of the second and third divided voltages V_d2 and V_d3 out of the three divided voltages V_d1 to V_d3 are higher than the voltage level of the reference voltage Vref, the comparison signal generation unit 212 may enable the second and third comparison signal COM_2 and COM_3 out of the threecomparison signals COM_1 to COM_3. When only the second and third comparison signal COM_2 and COM_3 are enabled, it may indicate that the voltage level of the external voltage VDD is higher than the first preset voltage level.

When all of the voltage levels of the first to third divided voltages V_d1 to V_d3 are higher than the voltage level of the reference voltage Vref, the comparison signal generation unit 212 may enable all of the first to third comparison signals COM_1 to COM_3. When all of the first to third comparison signals COM_1 to COM_3 are enabled, it may indicate that the voltage level of the external voltage VDD is higher than a second preset voltage level, which is higher than the first preset voltage level.

The decoding unit 213 may enable one of the first to fourth delay control signals Delay_ctrl<0:3> by decoding the first to third comparison signals COM_1 to COM3.

For example, when all of the first to third comparison signals COM_1 to COM3 are disabled, the decoding unit 213 may enable the first delay signal Delay_ctrl<O> selected between the first to fourth delay control signals Delay_ctrl<0:3>. When only the third comparison signal COM_3 out of the three comparison signals COM_1 to COM3 is enabled, the decoding unit 213 may enable only the second delay control signal Delay_ctrl<1> selected between the first to fourth delay control signals Delay_ctrl<0:3>. When only the second and third comparison signals COM_2 and COM_3 out of the three comparison signals COM_1 to COM3 are enabled, the decoding unit 213 may enable only the third delay control signal Delay_ctrl<2> of the first to fourth delay control signals Delay_ctrl<0:3>. When all of the first to third comparison signals COM_1 to COM3 are disabled, the decoding unit 213 may enable only the fourth delay signal Delay_ctrl<0> selected between the first to fourth delay control signals Delay_ctrl<0:3>.

When all of the first to third comparison signals COM_1 to COM_3 are disabled, that is, when the voltage level of the external voltage VDD is lower than the preset voltage levels, the delay control unit 210 may enable the first delay control signal Delay_ctrl<0> selected between the first to fourth delay control signals Delay_ctrl<0:3>.

When only the third comparison signal COM_3 out of the three comparison signals COM_1 to COM_3 is disabled, that is, when the voltage level of the external voltage VDD is equal to the preset voltage level, the delay control unit 210 may enable the second delay control signal Delay_ctrl<1> selected between the first to fourth delay control signals Delay_ctrl<0:3>.

When only the second and third comparison signals COM_2 and COM_3 of the first to third comparison signals COM_1 to COM_3 are enabled, that is, when the voltage level of the external voltage VDD is higher than the first preset voltage level, the delay control unit 210 may enable the third delay control signal Delay_ctrl<2> selected between the first to fourth delay control signals Delay_ctrl<0:3>.

When all of the first to third comparison signals COM_1 to COM_3 are enabled, that is, when the voltage level of the external voltage VDD is higher than the second preset voltage level, the delay control unit 210 may enable the fourth delay control signal Delay_ctrl<3> selected between the first to fourth delay control signals Delay_ctrl<0:3>.

The delay control unit 210 may sequentially enable the first to fourth delay control signals Delay_ctrl<0:3> by one, as the voltage level of the external voltage VDD increases.

The variable delay unit 220 may determine a delay time in response to the first to fourth delay control signals Delay_ctrl<0:3>, delay the internal command CMD_int by the determined delay time, and output the delayed internal command as the delayed command CMD_d. For example, when only the first delay control Delay_ctrl<0> selected between the first to fourth delay control signals Delay_ctrl<0:3> is enabled, the internal command CMD_int may be outputted as the delayed command CMD_d only through the first delay 221-1. When only the second delay control Delay_ctrl<1> selected between the first to fourth delay control signals Delay_ctrl<0:3> is enabled, the internal command CMD_int may be outputted as the delayed command CMD_d through the first and second delays 221-1 and 221-2. When only the third delay control Delay_ctrl<2> selected between the first to fourth delay control signals Delay_ctrl<0:3> is enabled, the internal command CMD_int may be outputted as the delayed command CMD_d through the first and second delays 221-1 and 221-2 and the third delay 221-3. When only the fourth delay control Delay_ctrl<3> selected between the first to fourth delay control signals Delay_ctrl<0:3> is enabled, the internal command CMD_int may be outputted as the delayed command CMD_d through the first to third delays 221-1 to 221-3 and the third delay 221-4.

As the voltage level of the external voltage VDD increases, the variable delay unit 220 may allow the internal command CMD to pass through a larger number of delays and output the delayed internal command as the delayed command CMD_d. That is, the variable delay unit 220 may increase the delay time as the voltage level of the external voltage VDD increases. The variable delay unit 220 may delay the internal command CMD_int by the increased delay time, and output the delayed internal command as the delayed command CMD_d.

Therefore, as the voltage level of the external voltage VDD increases, the command transmitter 200 may delay the internal command CMD by a larger delay time, and output the delayed internal command as the delayed command CMD_d.

The data storage area 300 may operate in response to the delayed command CMD_d. For example, when the delayed command CMD_d is a column-related command such as a read or write command, the data storage area 300 may perform a column operation.

The semiconductor memory apparatus according to an embodiment of the present disclosure may control the time at which a command for performing an operation is inputted to an internal circuit (e.g., data storage area) according to the voltage level of an operating voltage applied from outside (e.g., an external voltage for the operation of the semiconductor memory apparatus). More specifically, the semiconductor memory apparatus may increase the delay time by which the command is delayed as the voltage level of the external voltage increases, thereby increasing the time at which the command is transmitted to the data storage area. Furthermore, since the delay time of the delays decreases as the voltage level of the external voltage increases, the semiconductor memory apparatus may generate the delayed command by increasing the number of delays through which the internal command passes when the voltage level of the external voltage increases. Therefore, regardless of the change in voltage level of the external voltage, the command may be transmitted to the data storage area at predetermined times.

While certain embodiments have been described above, it will be understood to those skilled in the art that the embodiments described are by way of example only. Accordingly, the semiconductor memory apparatus described herein should not be limited based on the described embodiments. Rather, the semiconductor memory apparatus described herein should only be limited in light of the claims that follow when taken in conjunction with the above description and accompanying drawings.

What is claimed is:

1. A semiconductor memory apparatus comprising:
a command decoder configured to decode an external command and output the decoded command as an internal command;
a command transmitter configured to determine a delay time in response to a voltage level of an external voltage being applied to the semiconductor memory apparatus, delay the internal command by the determined delay time, and output the delayed internal command as a delayed command; and
a data storage area configured to receive the delayed command, and perform an operation according to the delayed command,
wherein the command transmitter comprises:
a delay control unit configured to generate a plurality of delay control signals in response to the voltage level of the external voltage; and
a variable delay unit configured to determine a delay time in response to the plurality of delay control signals, delay the internal command by the determined delay time, and output the delayed internal command as the delayed command,
wherein the delay control unit comprises:
a divided voltage generation unit configured to generate a plurality of divided voltages by dividing the external voltage;
a comparison signal generation unit configured to generate a plurality of comparison signals by comparing the plurality of divided voltages to a voltage level of a reference voltage, respectively; and
a decoding unit configured to enable one of the plurality of delay control signals in response to the plurality of comparison signals.

2. The semiconductor memory apparatus according to claim 1, wherein the command transmitter increases the delay time as the voltage level of the external voltage increases, and delays the internal command by the increased delay time.

3. The semiconductor memory apparatus according to claim 1, wherein the variable delay unit comprises:
a delay chain comprising a plurality of delays coupled in series;
an input selection unit configured to input the internal command to one of the plurality of delays in response to the plurality of delay control signals, and
wherein an output of the delay chain is the delayed command.

4. A semiconductor memory apparatus comprising:
a command transmitter configured to receive an internal command, delay the received internal command, and output the delayed internal command as a delayed command; and
a data storage area configured to perform an operation according to the delayed command,
wherein the command transmitter determines a number of delays through which the internal command passes according to the voltage level of an external voltage,
wherein the command transmitter comprises:
a delay control unit configured to generate a plurality of delay control signals in response to the voltage level of the external voltage; and
an input selection unit configured to input the internal command to one of the plurality of delays in response to the plurality of delay control signals,
wherein the delay control unit comprises:
a divided voltage generation unit configured to generate a plurality of divided voltages by dividing the external voltage;
a comparison signal generation unit configured to generate a plurality of comparison signals by comparing the plurality of divided voltages to a voltage level of a reference voltage, respectively; and
a decoding unit configured to enable one of the plurality of delay control signals in response to the plurality of comparison signals.

5. The semiconductor memory apparatus according to claim 4, wherein the command transmitter increases the number of the delays through which the internal command passes, as the voltage level of the external voltage increases.

6. The semiconductor memory apparatus according to claim 4, wherein the command transmitter comprises the plurality of delays coupled in series, and increases the number of the delays through which the internal command is passed, as the voltage level of the external voltage increases.

7. The semiconductor memory apparatus according to claim 6, wherein the command transmitter comprises an input selection unit configured to input the internal command to one of the plurality of delays according to the voltage level of the external voltage.

8. A semiconductor memory apparatus comprising:
a delay control unit configured to detect an external voltage level being applied to the semiconductor memory apparatus, and provide a delay control signal selected, depending on the external voltage level, between a plurality of delay control signals; and
a variable delay unit comprising a plurality of delays coupled in series, each delay having an input node for receiving an internal command generated based on the delay control signal,
wherein a total delay time of the variable delay unit varies depending on which delay receives the internal command,
wherein the delay control unit comprises:
a divided voltage generation unit configured to generate a plurality of divided voltages by dividing the external voltage level;
a comparison signal generation unit configured to generate a plurality of comparison signals by comparing each divided voltage to a reference voltage level; and
a decoding unit configured to enable one of the plurality of delay control signals in response to the plurality of comparison signals.

9. The semiconductor memory apparatus according to claim 8, wherein the total delay time of the variable delay unit increases along with an increase in the external voltage level.

10. The semiconductor memory apparatus according to claim 8, wherein the variable delay unit comprises an input selection unit configured to provide the internal command to one of the plurality of delays in response to the plurality of delay control signals.

* * * * *